SELECTIVE GOLD DOPING FOR HIGH RESISTIVITY REGIONS IN SILICON

Filed Oct. 31, 1966

James G. Harper
INVENTOR.

BY
Robert O. White
ATTORNEY

United States Patent Office 3,440,114
Patented Apr. 22, 1969

3,440,114

SELECTIVE GOLD DOPING FOR HIGH RESISTIVITY REGIONS IN SILICON

James G. Harper, Garland, Tex., assignor to Texas Instruments Incorporated, Dallas, Tex., a corporation of Delaware Filed Oct. 31, 1966, Ser. No. 590,882
Int. Cl. H01l 7/44, 11/00
U.S. Cl. 148—187 8 Claims

ABSTRACT OF THE DISCLOSURE

A method of forming high resistivity regions in a silicon wafer by (1) diffusing a conductivity determining impurity through one face of the wafer, (2) forming a mask having an opening over the face of the wafer, (3) mechanically stressing the wafer beneath the opening, e.g., by scribing the wafer surface, and (4) diffusing gold through the opening into the wafer.

This invention relates to a selectively doped silicon slice and a method for fabricating same, and more particularly relates to silicon slices having high resistivity regions suitable for fabrication into various semiconductor devices.

A semiconductor is a crystalline material having electrical resistivity between that of metals and insulators. Of particular interest is the semiconductor silicon which has found extensive utilization in the fabrication of transistors and similar devices. In the development of advanced silicon devices, various design goals require alteration of the electrical resistivity of the basic silicon crystalline structure. For instance, in the manufacture of so-called integrated circuits, it is sometimes advantageous to provide regions of electrical isolation in the unitary silicon material. Another example of the utilization of high resistivity regions is related to the transfer of high frequency signals over deposited ohmic conductors susceptible of capacitive losses at high signal frequencies. Other examples are known to those skilled in the art and further elaboration is not necessary. With a view of the above noted problems and many others in mind, it is therefore an object of the present invention to provide a new and improved method of forming a high resistivity region in a silicon wafer.

Another object of the present invention is to provide a new and improved method for forming isolation zones for silicon slices which separate regions within the slices to prevent electrical interconnection between regions.

One object of the present invention is to provide a new and improved silicon wafer having a high resistivity region of perhaps 5,000 ohm-centimeters underlying ohmic electrical conductors for reducing the capacitive losses occuring at high frequencies.

Another object of the present invention is to provide a new and improved method of fabricating high resistivity regions in silicon slices in which the silicon slice is mechanically stressed at unmasked portions overlying the crystalline structure into which gold is directionally diffused to form a region of high resistivity.

Other objects and advantages of the present invention will become more readily apparent after consideration of the included specification and drawings wherein.

Figure 1:
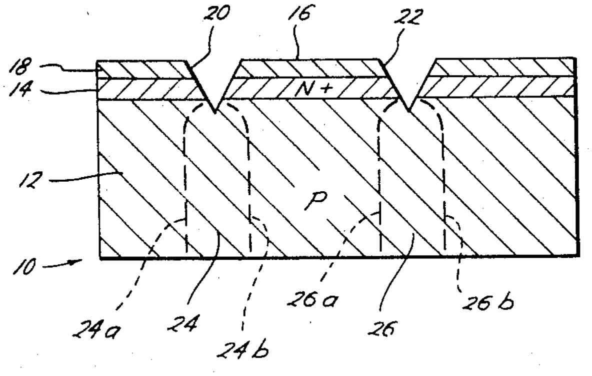
FIGURE 1 is a sectional view of a silicon slice wherein the method of the present invention has formed a region of high resistivity therein.

Attention is first directed to FIGURE 1 which illustrates the silicon wafer indicated generally at 10. The silicon wafer includes a boron doped crystalline structure to yield a positive (P) type semiconductor region which extends vertically through the region indicated generally at 12. As originally formed, the silicon wafer or slice 10 is approximately 9 or 10 mils thick and is sawed, lapped and mechanically polished. A diffusion step is accomplished to establish a relatively low resistivity N-type region (N+) perhaps 0.8 to 1.0 mil deep into the silicon wafer 10 as indicated at 14 and measured from the upper face 16 of the wafer 10. A protective mask of silicon dioxide 18 is formed above the N+ layer 14 and preferably extends fully over the face 16 of silicon wafer 10.

Techniques are known to those skilled in the art for forming the N+ type layer 14 and the silicon dioxide layer 18. As a generalization, the N+ type layer 14 is formed by placing the wafer 10 in a special high temperature furnace having an atmosphere containing an N-type dopant. When the temperature is raised in the furnace, the impurity is diffused into the exposed silicon forming the highly doped N+ region 14. Thereafter, the silicon slice 10 is oxidized to form the silicon dioxide layer 18, and one known technique comprises the steps of thermally oxidizing the upper surface by passing steam and oxygen over the silicon wafer at about 1200 degrees centigrade for a period of time related to the desired thickness of silicon dioxide 18. In any event, the art includes appropriate techniques for forming layers of a desired conductivity type and layers of silicon dioxide.

After the integral formation of the two layers below the upper surface 16 of the wafer 10 is completed, the silicon dioxide mask 18 is altered to define unmasked portions overlying regions in which the high resistivity regions are to be formed, and the unmasked portions are mechanically stressed to produce a diffusion direction preference in the silicon wafer 10. The preferred method is the utilization of scribe marks or saw marks which extend into the wafer from the upper surface 16 by a distance of about 2 mils. Referring again to FIGURE 1, the silicon wafer 10 is shown in sectional view with V-shaped cut marks 20 and 22 and which are the result of passing a saw over the face 16 for cutting to the desired depth to mechanically stress the silicon wafer 10 below the dioxide mask 18. In this regard, it will be noted that the saw marks serve two purposes, including the unmasking of selected portions of the surface 16 by mechanical removal of the silicon dioxide layer 18 and the further effect of mechanically damaging or stressing the crystalline structure of the wafer 12.

A next step in the method of the present invention is the diffusion of gold into the crystalline structure of this silicon wafer 10. One technique found suitable has been the evaporation of about 400 mg. of gold in an appropriate device from a distance of about 14 inches. Exposure of the silicon wafer 10 to an elevated temperature for an interval of time then diffuses the gold selectively and directionally into the silicon wafer 10. By way of example, it has been found acceptable to expose the silicon wafer 10 to about 1000 degrees centigrade for about 5 minutes to permit the gold to apparently diffuse through the saw marks 20 and 22 directionally into the crystalline structure of the silicon wafer 10. In this regard, attention is redirected to FIGURE 1 wherein a first region 24 is defined by the approximate boundaries indicated at **24*a* and 24*b*. In addition, a second region is indicated at 26 which is defined by the approximate boundaries 26*a* and 26*b* immediately beneath the saw mark 22**. While it will be understood that FIGURE 1 is a sectional view, it will be further appreciated that the saw marks 20 and 22 which control the location of the high resistivity zones 24 and 26, respectively, are scribed on the face 16 of the wafer 10 to accord with predetermined patterns whereby the regions 24 and 26 can be used upon further utilization of the wafer 10 to form various and sundry solid state circuit components or elements.

While the gold is said to dope the silicon slice 10, it should be understood that the doping does not form the conventional diode junction.

Concerning the general description of the high resistivity regions of the silicon slice 10, it should be noted that the resistivity is probably in the range of 5,000 ohm-centimeters. Moreover, the width of the gold doped regions approximates 30 mils and is roughly uniform in width with variation not exceeding 10%. The consistent width of the regions seems to be the result of the directional perference of the gold doping and extends generally from the saw marks 20 and 22.

Figure 2:
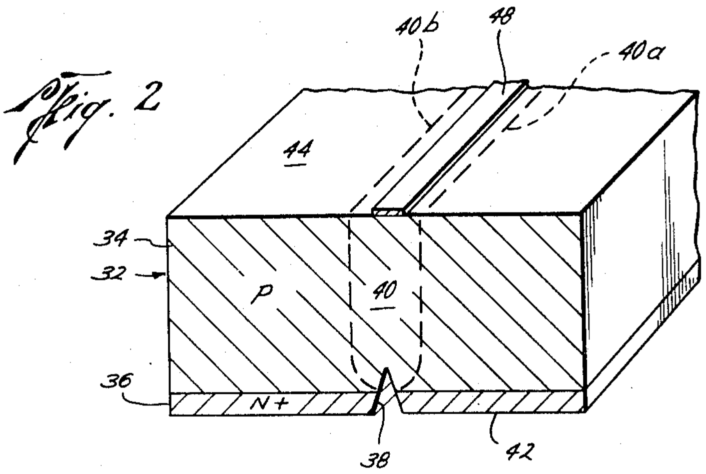
FIGURE 2 is a sectional view of a silicon slice in accordance with the present invention and further showing one use of the present invention.

Attention is next directed to FIGURE 2 which illustrates one use of the present invention wherein a silicon slice 32 is shown having additional circuit elements associated therewith. In the sectional view of 32, the main body of the silicon wafer is again of the P type crystalline structure and is indicated at 34. The N+ type material is indicated at 36 and is presently shown on a nether side of the silicon wafer 32 for reasons to be noted. A saw mark is indicated at 38 and defines the location of a high resistivity zone indicated roughly at 40. It will be noted that the silicon dioxide layer previously described with respect to FIGURE 1 is omitted from FIGURE 2, there being techniques readily available for removal of the silicon dioxide after it serves the purpose of masking the face 32 of the silicon wafer 32 to limit or control the location of the high resistivity region 40. As will be implied by FIGURE 2, the lower face 42 is scribed by the saw mark 38 along a straight line and the region 40 extends approximately parallel to and in alignment with saw mark 38 as best indicated by the region boundary lines 40*a* and 40*b* shown on the upper surface 44 of the silicon wafer 32. By way of example, it was noted that the width of the high resistivity region 40 can be approximately 30 mils. The 30 mil width is more than adequate to encompass the interconnecting ohmic lead 48 shown in FIGURE 2. The lead 48 is formed on the upper surface of the silicon slice 32 by known and conventional techniques and is conventionally used for the transfer of electrical signals. On the impression of an electrical signal on the lead 48 having a frequency in the megahertz or gigahertz range, capacitive losses reduce the signal amplitude and make the lead placement and length critical. In view of these facts, the present invention provides a structure whereby capacitive reactance is increased to reduce the loading on the electrical lead 48. By the utilization of the high resistivity region 40, and further in view of the wide span of the region available for placement of the ohmic lead 48, the quality of the high frequency signal impressed on the lead 48 is materially improved from the utilization of the present invention.

Implicit in the above discussion of FIGURE 2 is the fact that the high resistivity region extends from the lower surface of the silicon slice 32, and the opposite face of the silicon slice 32 is utilized in the fabrication of known solid state circuit components or elements.

Figure 3:
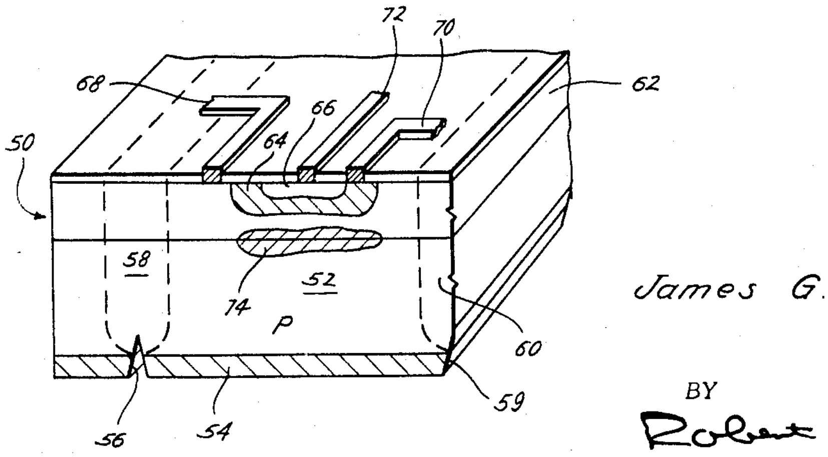
FIGURE 3 is a sectional view illustrating an additional use of the present invention in the fabrication of so-called integrated circuits.

Attention is next directed to FIGURE 3 of the drawings which illustrates a silicon wafer indicated generally at 50 having a P-type crystalline structure 52 adjacent to a lower N+-type layer 54. At the nether surface of the silicon wafer 50, two saw marks are indicated, one of the saw marks 56 being associated with a region 58 of high resistivity extending into the silicon wafer 50 while a second saw mark 59 is associated with formation of a high resistivity zone 60. It will be noted that the zone 60 is at the right-hand section line defining the silicon wafer 50 as drawn in FIGURE 3. The structure shown in FIGURE 3 provides two regions of high resistivity at 58 and 60 which surround and isolate an active circuit component. In FIGURE 3, an NPN transistor of the so-called integrated circuit variety includes a collector region 62, a base zone 64, and an emitter 66 formed within the base zone 64. The circuit elements provide conventional transistor action to electrical leads indicated for the collector at 68, the base 70, and the emitter 72. Each of the ohmic leads is shown with incomplete connections, the purpose of FIGURE 3 being solely to illustrate the presence of a typical circuit element such as the NPN transistor and that without regard to the circuit connections of the transistor.

The transistor shown in FIGURE 3 further includes a buried N+ layer 74 which lowers the saturation resistance of the transistor. Without being further specific about the description of the transistor, it is best to describe the device as an epitaxial semiconductor integrated transistor. Of significance to the structure in FIGURE 3 is the fact that, while the transistor includes active circuit elements, the electrical activity is confined by the high resistivity zones or regions 58 and 60.

The circuit elements associated with the above noted NPN transistor are generally described as active elements and to this extent, there is a possibility that electrical signals from the various elements can extend through the silicon slice 50. The present invention provides an isolation zone preventing the interconnection of the transistor to other components located in the silicon wafer 50. Therefore, both high resistivity zones 58 and 60 limit interconnection of the transistor elements with other components in the integrated circuitry within the unitary body of silicon. Additional transistors can be formed on the other sides of the high resistivity zones with ohmic interconnection leads passing over the high resistivity zones to provide appropriate circuits interconnections.

This, of course, provides another indicated use of the device of the present invention.

It is obvious that other uses exist for the product of the present invention. Likewise, it will be obvious that many methods of utilizing the principles of this invention will occur to those skilled in the art. Therefore, the foregoing provides a preferred method of practice of the present invention and indicates uses of the product described herein, but the scope of the present invention is defined by the following claims.

What is claimed is:

1. A method of forming a high resistivity region in a silicon wafer comprising the steps of:
   (a) diffusing a conductivity determining impurity through one face of the silicon wafer to a predetermined depth;
   (b) forming a mask over the silicon wafer face;
   (c) said mask defining an unmasked portion overlying a region in which the high resistivity region is to be formed;
   (d) mechanically stressing the unmasked portion overlying the region to produce a diffusion direction preference in the silicon wafer; and
   (e) diffusing gold through the unmasked portion and into the silicon wafer to form a region of high resistivity in the silicon wafer.

2. The method of claim 1 wherein the step of diffusing the impurity forms an N+ layer in the silicon wafer.

3. The method of claim 1 wherein the mask is an oxide of silicon.

4. The method of claim 1 wherein the unmasked portion is formed by mechanically removing the mask in such a way as to also mechanically stress the unmasked portion.

5. The method of claim 1 wherein the mask material is silicon dioxide and the gold is diffused at a temperature approximately 1000 degrees centigrade for approximately five minutes.

6. The method of claim 1 wherein the silicon wafer has a second face opposite the first face and the gold diffusion extends approximately through the wafer to the second face, and an interconnecting ohmic lead is formed thereupon in near proximity to the high resistivity region.

7. A method of forming a high resistivity region in a silicon wafer comprising the steps of:

(a) diffusing an N+ conductivity determining impurity through one face of the silicon wafer to a depth of approximately 0.8 mil;
(b) masking the silicon wafer face with a layer of silicon dioxide;
(c) forming scribe marks across the face of the silicon wafer to locate regions in which high resistivity is to be formed in the wafer;
(d) said scribe marks extending through the layer of silicon dioxide and into the silicon wafer;
(e) placing a gold layer over the scribe marks; and
(f) heating the silicon wafer to approximately 1000 degrees centigrade for about five minutes to diffuse the gold into the silicon wafer to form a high resistivity region extending inwardly from the scribe marks.

8. The method of claim 7 wherein the scribe marks are formed by a saw and extend about two mils into the silicon wafer, and wherein the gold layer is placed on the face of the silicon wafer by evaporation.

References Cited

UNITED STATES PATENTS

| | | | |
|---|---|---|---|
| 2,954,307 | 9/1960 | Shockley | 148—190 X |
| 3,132,408 | 5/1964 | Pell | 148—188 X |
| 3,174,112 | 3/1965 | Stelmak. | |
| 3,210,677 | 10/1965 | Lin et al. | |
| 3,270,235 | 8/1966 | Loebner. | |
| 3,271,201 | 9/1966 | Pomerantz. | |
| 3,307,984 | 3/1967 | Frazier | 148—187 |
| 3,377,215 | 4/1968 | Carter et al. | |

L. DEWAYNE RUTLEDGE, *Primary Examiner.*

R. LESTER, *Assistant Examiner.*

U.S. Cl. X.R.

29—576; 148—33, 185, 186, 188, 190; 317—235